United States Patent [19]

Von Flue

[11] Patent Number: 4,903,240

[45] Date of Patent: Feb. 20, 1990

[54] READOUT CIRCUIT AND METHOD FOR MULTIPHASE MEMORY ARRAY

[75] Inventor: Timothy A. Von Flue, Beaverton, Oreg.

[73] Assignee: Tektronix, Inc., Beaverton, Oreg.

[21] Appl. No.: 156,492

[22] Filed: Feb. 16, 1988

[51] Int. Cl.[4] ............................................. G06F 12/00
[52] U.S. Cl. ............................ 365/189.02; 364/239.2; 364/243.6; 364/243; 364/238; 364/238.7; 364/942; 364/964; 365/239; 365/240; 341/100; 341/101; 370/77; 370/78; 370/79; 370/80
[58] Field of Search ... 364/200 MS File, 900 MS File; 365/219, 220, 221, 239, 240, 189.02; 341/100, 101

[56] References Cited

U.S. PATENT DOCUMENTS

| | | | |
|---|---|---|---|
| 3,573,744 | 4/1971 | Rigazio | 364/200 |
| 3,763,480 | 10/1973 | Weimer | 365/238 |
| 3,846,762 | 11/1974 | Gregory et al. | 364/900 |
| 3,995,253 | 11/1976 | Morrin, II et al. | 364/900 |
| 4,330,852 | 5/1982 | Redwine et al. | 365/238 |
| 4,339,804 | 7/1982 | Davison et al. | 364/900 |
| 4,467,443 | 8/1984 | Shima | 364/900 |
| 4,588,986 | 5/1986 | Byrne | 341/100 |
| 4,663,729 | 5/1987 | Matick et al. | 364/900 |
| 4,667,305 | 5/1987 | Dill et al. | 364/900 |
| 4,794,627 | 12/1988 | Grimaldi | 341/101 |

Primary Examiner—Gareth D. Shaw
Assistant Examiner—Gopal C. Ray
Attorney, Agent, or Firm—Boulden G. Griffith

[57] ABSTRACT

A multiphase memory array is read out using two multiplexers and a demultiplexer under the control of a state machine. The state machine enables one portion of the memory array at a time using a gate to multiplex the memory portion outputs. While a particular portion is enabled, a bit multiplexer associated with that portion is directed by the controlling state machine to sequentially select each bit at the current address in that memory portion for output. A shift register demultiplexer performs serial to parallel conversion on the sequential bits from each memory portion to convert them to a readback byte or word for output. After the byte or word has been read out, the state machine enables the next portion of the memory array and repeats the multiplexing and demultiplexing process for the data at the same address in that memory portion. When all of the memory portions have read out, the address to the memory array is changed and the whole process is repeated for the data at the new address.

6 Claims, 2 Drawing Sheets

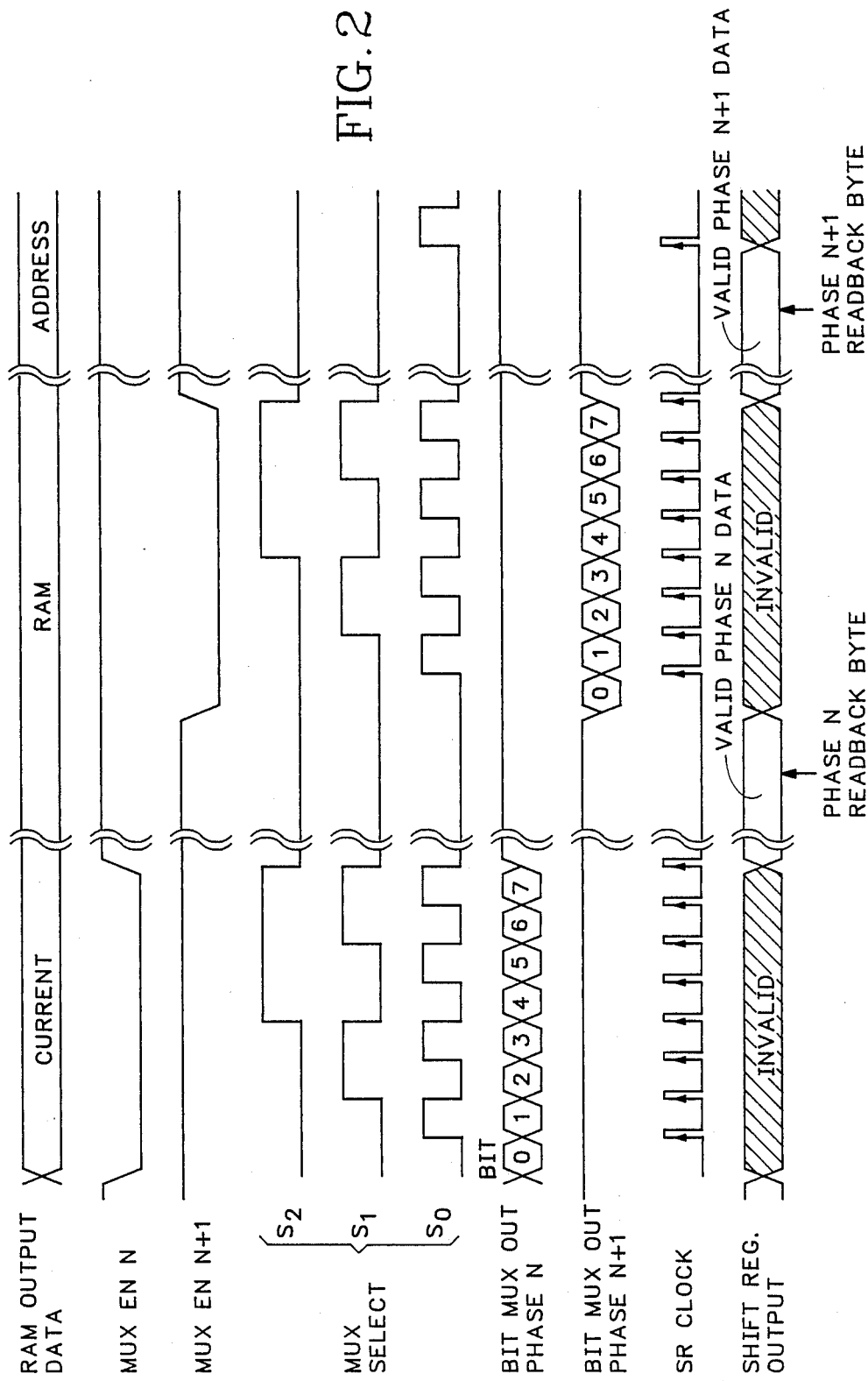

READOUT CIRCUIT AND METHOD FOR MULTIPHASE MEMORY ARRAY

BACKGROUND OF THE INVENTION

This invention relates to the field of memory readout circuitry and techniques, and more particularly to circuits and techniques for readback of data stored in multiphase memory arrays. Such arrays achieve higher speeds by storing sequential bytes or words of data in different memory portions on different phases of a system clock.

The effective writing speed of a memory system may be increased by the use of multiple memories. In such a memory system the high speed stream of input data is treated as if it were comprised of several sets of data multiplexed together. This stream of input data is demultiplexed by the memory write circuitry so that only every n-th bit of data is sent to the same memory portion, with successive bits being sent to other memories within a gang of multiple memories at a faster rate than any one of the individual memories could handle the data.

For example, if an input data stream consisted of four bits of data, ABCD, and two memories were being employed to double the maximum speed attainable, bit A would go to memory 1, bit B to memory 2, bit C to memory 1, and bit D to memory 2.

Such a multiple memory may operate off of different phases or edges of the same clock. Thus, in the preceding example, memory 1 could run off the rising edge of a system clock while memory 2 was running off the falling edge of the same clock. Alternatively, both memories could be clocked by a clock and its complement, using the same edge.

In such a system, both memories can be operated at or near their individual maximum speeds, permitting data which appears at the input to the system to be stored at a rate which is a multiple of the speed of the individual memories. In our example, with two memories alternating to receive one stream of input data, the speed of the memory system as a whole is twice that of the individual memories themselves.

Once data has been demultiplexed into these separate memories, it must be multiplexed back together in order to be meaningfully read out. In some environments it is necessary to maximize reading-out speed as well as writing-in speed. In other applications, such as that in which the instant invention is used, minimizing the number of readback lines, not the time to perform a readback is the most important design goal.

What is desired is a circuit that will require a minimum of total readback lines and a limited number of components, and which will allow the original stream of input data to be reconstructed as it is read out of the multiphase memory array.

SUMMARY OF THE INVENTION

Two multiplexers, one demultiplexer, and a state machine that controls the operation of the multiplexers and the demultiplexer are used to read data out of a multiphase memory array having a number of memory portions. For a given address in the multiphase memory array, the controlling state machine directs a first multiplexer to enable input from the first of the memory portions in the array. A second multiplexer, associated with that memory portion, sequentially selects for readback one bit at a time from the data byte or word stored at that particular address in the enabled memory portion. The serial stream of data bits from the second multiplexer passes through the first multiplexer to the demultiplexer which reconstructs by serial to parallel conversion the data byte or word that was stored at that address in the first memory portion. That byte or word is then read out of the memory array by an external device.

Next, the first multiplexer is directed to enable input from the next memory portion, where the next byte or word of data is stored at the same address. The second multiplexer which is associated with the next memory portion then selects in sequence each bit in the byte or word at this location in this memory portion. The resulting stream of data bits passes through the first multiplexer to the demultiplexer, where it is converted by serial to parallel conversion into the next byte or word of data for readout by the external device. This process continues for each memory portion in the multiphase array, each time reading from the location addressed by the same address.

When all of the data has been sequentially read from that address in every portion of the memory array, the address being applied to the whole memory array is advanced and the controlling state machine is reset to its initial condition, causing the first memory portion to be enabled again so that the whole process may be repeated for the plurality of data bytes or words stored at the next address in the array.

BRIEF DESCRIPTION OF THE DRAWINGS

FIG. 2 is a timing diagram of the operation of the invention.

DETAILED DESCRIPTION OF THE INVENTION

Figure 1:
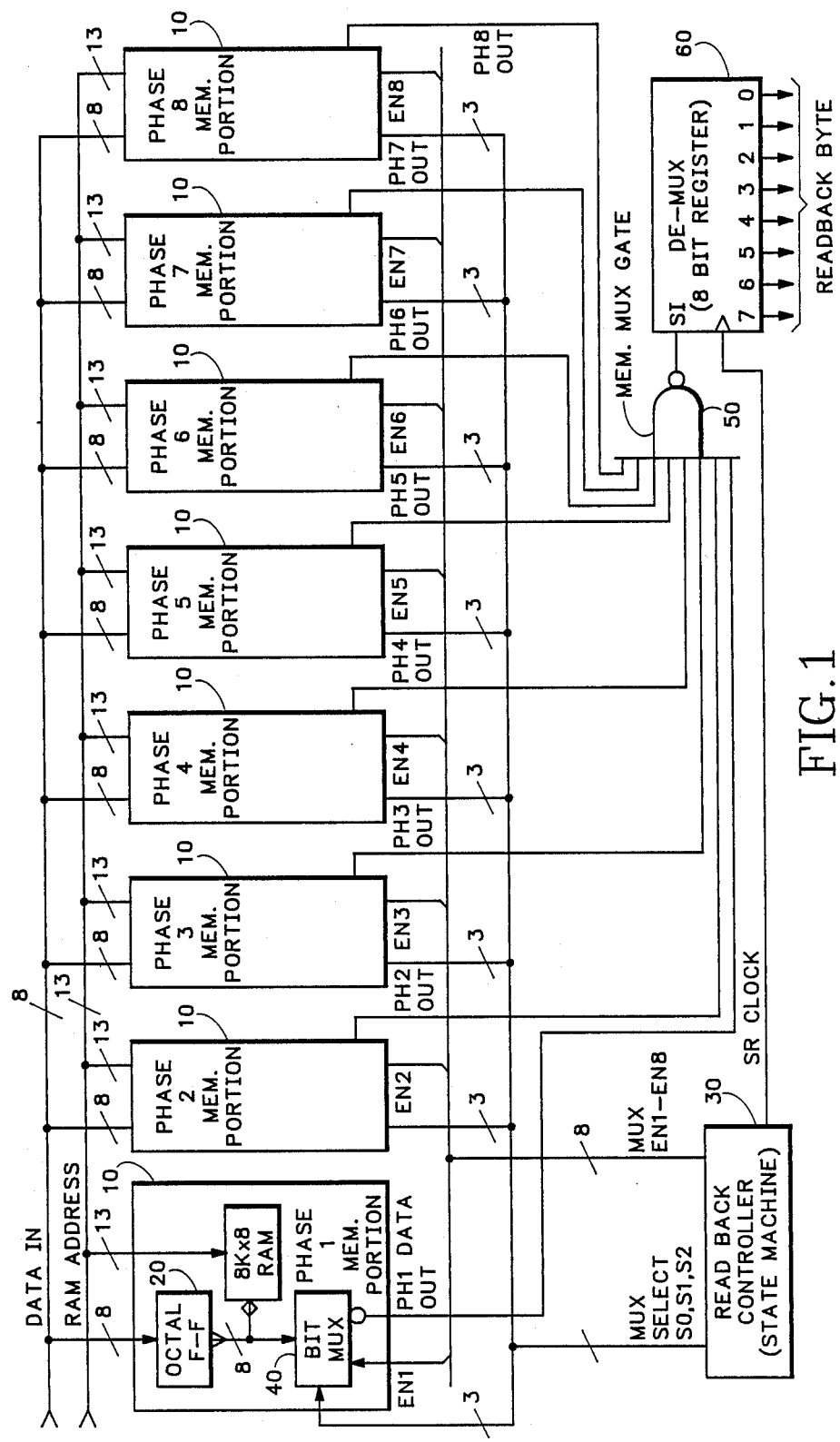
FIG. 1 is a schematic and block diagram of the invention.

Referring to FIG. 1, 8 Data In lines and 13 RAM Address lines are connected in parallel to each of eight memory portions 10, phase 1 to phase 8. Eight phases of a memory clock (not shown) clock the input data into the input octal flip-flops 20 of the eight memory portions 10 in rapid succession. The data input rate may be up to eight times faster than the speed of the individual memory write cycles. Bytes that arrive sequentially on the Data In lines are clocked into adjacent memory portions 10 in the array by successive phases of the eight phase clock. And, bytes of data stored at successive addresses in a particular memory portion were separated by seven bytes of other data in the input stream as the data arrived at the memory array on the Data In lines.

Referring to FIG. 2 in conjunction with FIG. 1, for each RAM address, the data from all of the memory portions is enabled at once by the RAM address lines. To reconstruct the stream of input data at the output, the Readback Controller 30, a state machine, enables the output of each of the memory portions 10 in succession by use of the Bit Mux 40 enable signals Mux EN1--EN8. In FIG. 2 only two of these enable signals are shown, Mux EN N and Mux EN N+1.

While the Bit Mux 40 of a particular memory portion 10 is enabled, all others are disabled, causing their outputs to be held high. For example, in FIG. 2, while Mux EN N is low, all of the other Mux EN lines, here represented by Mux EN N+1, are high. During the time that that particular memory portion 10 output is enabled, the Readback Controller 30 directs the Bit Mux 40 within that portion, via the Mux Select signals S0, S1, and S2, to sequentially select for output each bit of the byte of data stored in that memory portion at the current address.

Referring to FIG. 1, the NAND gate, Mem. Mux Gate 50, effectively operates as a multiplexer, only passing data from one portion at a time, as its inputs are manipulated by the Readback Controller 30. True data out of the Bit Muxes 40 is low-going, while the outputs of all of the other Bit Muxes will be high because they are not enabled. Consequently, a bit true in the memory appears at the output of the NAND gate, Mem. Mux Gate 50, as a high-going signal, while the absence of a bit in the data of the memory appears at the output of the NAND gate 50 as a low signal. It should be noted that with positive-going outputs from the Bit Muxes 40, this same scheme could readily be implemented using an OR gate in place of the NAND gate as the Mem. Mux Gate 50.

Referring again to FIG. 2 in conjunction with FIG. 1, by orchestrating these two levels of multiplexing, the Readback Controller 30 causes a serial stream of data bits, the NANDed sum (not shown in FIG. 2) of all phases of Bit Mux Out, to arrive at the input of the 8-bit shift register De-Mux 60. As the bits from each memory portion 10 arrive in order at the shift register De-Mux 60, SR Clock from the Readback Controller 30 cause the bits to be shifted through the shift register 60, converting these serial bits into a parallel Readback Byte ready for readback by external circuitry (not shown). After each byte of data has been readied for output, the Readback Controller 30 disables the Bit Mux 40 for that memory portion 10 by causing Mux EN N to go high. The Readback Controller 30 also withholds the SR Clock signals during this time, waiting for an indication that the Readback Byte has been read out. When such an indication is received, the Readback Controller 30 enables, via Mux EN N+1, the path from the next memory portion 10.

After each memory portion 10 at the current RAM address has been read back in the manner described above, the RAM address is changed and, when the RAM Data Output is stable at that new address, the whole process is repeated.

I claim:

1. A circuit for reading out the contents of a multiphase memory array having a plurality of memory portions, the circuit comprising:
    a plurality of means for multiplexing the bits, each associated with one of the memory portions, to multiplex a plurality of bits within each memory portion onto a single output line;
    means for multiplexing memory portions to enable one of the single output lines from the plurality of bit multiplexing means so as to multiplex the signals of each of the single output lines onto a single readout line;
    means for demultiplexing and holding, to present for readback on parallel output lines the bits from each memory portion; and
    means for controlling the bit multiplexing means, the memory portions multiplexing means, and the demultiplexing and holding means, so that for each memory portion in sequence the plurality of bits are held for readback on the parallel output lines.

2. A circuit as recited in claim 1 wherein the memory portions multiplexing means comprises a NAND gate having a plurality of inputs and an output, with the single output lines connected to the inputs of the NAND gate and the single readout line as the output.

3. A circuit as recited in claim 1 wherein the controlling means comprises a state machine.

4. A circuit as recited in claim 1 wherein the demultiplexing and holding means comprises a shift register receiving clock signals from the controlling means.

5. A method for reading out the contents of a multiphase memory array comprising the steps of:
    multiplexing between memory portions of the multiphase memory array;
    multiplexing between locations within each memory portion to produce a serial data stream;
    demultiplexing the serial data stream into bytes of data; and
    reading out the bytes of data.

6. A method as recited in claim 5 further comprising the step of changing an address to all of the memory portions and repeating all of the preceding steps to read out the data stored at the new address.

* * * * *